(12) United States Patent
Siegmanski et al.

(10) Patent No.: US 10,571,813 B2
(45) Date of Patent: Feb. 25, 2020

(54) CONNECTION ARRANGEMENT FOR A FORCE-FIT CONNECTION BETWEEN CERAMIC COMPONENTS

(71) Applicant: Carl Zeiss SMT GmbH, Oberkochen (DE)

(72) Inventors: Karsten Siegmanski, Aalen (DE); Peter Deufel, Koenigsbronn (DE); Viktor Kulitzki, Zwickau (DE); Stefan Xalter, Oberkochen (DE); Bernhard Gellrich, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 174 days.

(21) Appl. No.: 15/455,524

(22) Filed: Mar. 10, 2017

(65) Prior Publication Data
US 2017/0184982 A1 Jun. 29, 2017

Related U.S. Application Data

(63) Continuation of application No. PCT/EP2014/069642, filed on Sep. 15, 2014.

(51) Int. Cl.
*G03F 7/20* (2006.01)
*F16B 2/10* (2006.01)

(52) U.S. Cl.
CPC ............ *G03F 7/70733* (2013.01); *F16B 2/10* (2013.01)

(58) Field of Classification Search
CPC .... G03F 7/70733; G03F 7/70833; F16B 2/10; H01L 2924/00014; H01L 2924/00; H01L 2224/32225; H01L 2224/732014
See application file for complete search history.

(56) References Cited

U.S. PATENT DOCUMENTS

| 2,144,140 | A | * | 1/1939 | Batcheller | F16B 2/065 |
| | | | | | 24/514 |
| 3,836,794 | A | * | 9/1974 | Shimizu | H01L 41/107 |
| | | | | | 310/354 |
| 4,670,682 | A | * | 6/1987 | Harnden, Jr. | H01H 57/00 |
| | | | | | 200/181 |
| 4,678,957 | A | * | 7/1987 | Harnden, Jr. | H01H 57/00 |
| | | | | | 200/181 |

(Continued)

FOREIGN PATENT DOCUMENTS

| DE | 10 2013 209 012 A | 5/2014 |
| EP | 1513018 A1 | 3/2005 |

(Continued)

OTHER PUBLICATIONS

International Search Report for corresponding PCT Appl No. PCT/EP2014/069642, dated May 20, 2015.

(Continued)

*Primary Examiner* — Robert Sandy
*Assistant Examiner* — Louis A Mercado
(74) *Attorney, Agent, or Firm* — Fish & Richardson P.C.

(57) ABSTRACT

A connection arrangement is provided for a force-fit connecting ceramic components for a lithography apparatus. The connection arrangement includes first and a second ceramic components and a clamping device. The clamping device directly clamps the first and the second ceramic component against one another in a force-fit manner.

20 Claims, 5 Drawing Sheets

(56) References Cited

U.S. PATENT DOCUMENTS

| | | | |
|---|---|---|---|
| 4,854,016 A * | 8/1989 | Rice | A61G 13/101 |
| | | | 24/495 |
| 4,970,836 A * | 11/1990 | Brown | E04F 19/08 |
| | | | 49/465 |
| 6,158,729 A * | 12/2000 | Tsai | B25B 5/12 |
| | | | 269/136 |
| 6,202,266 B1 * | 3/2001 | Van den Branden | A47B 96/06 |
| | | | 24/507 |
| 8,777,535 B2 | 7/2014 | Manahan | |
| 9,351,565 B2 * | 5/2016 | Torrachi | F16B 2/065 |
| 9,633,635 B2 * | 4/2017 | Liao | G10D 13/026 |
| 2003/0058422 A1 | 3/2003 | Loopstra et al. | |
| 2005/0105070 A1 | 5/2005 | Bartray et al. | |
| 2014/0000186 A1 | 1/2014 | Yen | |
| 2014/0086680 A1 * | 3/2014 | Header | E04D 13/10 |
| | | | 403/374.3 |
| 2015/0167376 A1 | 6/2015 | Burgess | |

FOREIGN PATENT DOCUMENTS

| | | |
|---|---|---|
| EP | 1 531 364 A2 | 5/2005 |
| JP | S48-110711 | 12/1973 |
| JP | H03-117107 | 12/1991 |
| JP | 2003-158070 A | 5/2003 |
| JP | 2005-150732 A | 6/2005 |
| JP | 2010-004086 A | 1/2010 |

OTHER PUBLICATIONS

Japanese Office Action, with translation thereof, for corresponding Appl No. 2017-514405, dated Aug. 7, 2018.
Japanese Office Action, with translation thereof, for corresponding Appl No. 2017-514405, dated Apr. 2, 2019.
Taiwanese Office Action, with translation thereof, for corresponding Appl No. 104129837, dated Jun. 11, 2019.
Taiwanese Office Action, with English translation thereof, for corresponding TW Appl No. 104129837, dated Oct. 9, 2019.

* cited by examiner

CONNECTION ARRANGEMENT FOR A FORCE-FIT CONNECTION BETWEEN CERAMIC COMPONENTS

CROSS-REFERENCE TO RELATED APPLICATIONS

The present application is a continuation of, and claims benefit under 35 USC 120 to, international application PCT/EP2014/069642, filed Sep. 15, 2014. The entire disclosure of this application is incorporated by reference herein.

FIELD

The present disclosure relates to a connection arrangement for a force-fit connection between ceramic components for a lithography apparatus, a sensor frame for a lithography apparatus, a lithography apparatus and a method for a force-fit connection between ceramic components of a lithography apparatus.

BACKGROUND

By way of example, lithography apparatuses are used in the production of integrated circuits (IC) to image a mask pattern in a mask onto a substrate such as e.g. a silicon wafer. Here, a light beam produced by an optical system is directed onto the substrate through the mask.

Ceramic components are used in lithography apparatuses. The ceramic components are connected to one another. One option for connecting the ceramic components to one another lies in the use of metal screws that are guided through corresponding openings in the ceramic components. Interlocking ceramic-metal connection arrangements are disadvantageous in that a thermal expansion may lead to damage of the ceramic components. Moreover, interlocking connection arrangements involve a high level of precision. Furthermore, connection regions that are too small in interlocking connection arrangements may lead to damage of the ceramic components in the case of large tensile forces.

SUMMARY

The present disclosure seeks to provide an improved connection arrangement for ceramic components as well as a method for connecting ceramic components, wherein at least one of the aforementioned issues is resolved. In particular, it is an object of the present disclosure to provide a lithography apparatus or a sensor frame for a lithography apparatus with an improved connection arrangement for ceramic components.

This object is achieved by a connection arrangement for a force-fit connection between ceramic components for a lithography apparatus, which connection arrangement includes a first and a second ceramic component, and a clamping device. The clamping device directly clamps the first and the second ceramic component against one another in a force-fit manner.

As a result of the clamping device clamping the first and the second ceramic component directly against one another in a direct and force-fit, in particular frictionally engaged, manner, it is possible to dispense with an interlocking connection arrangement. Slippage between the ceramic components is prevented by the force-fit connection arrangement. Advantageously, the force-fit connection arrangement is easily detachable and easily accessible. Moreover, the force-fit connection is usable in a vacuum. Furthermore, the ceramic components cannot be damaged by tensile forces or thermal expansion.

Here, the term "directly" means that no further element is situated between the first ceramic component and the second ceramic component. The first ceramic component is pressed directly onto the second ceramic component by the clamping device.

In particular, the ceramic components can be shells, preferably of a sensor frame of the lithography apparatus. The shells are fastened to one another at the end sides thereof, in particular at end sides of flanges of the shells, via the clamping device. Preferably, a respective wall plane of the shells extends in the same direction as the clamping force acting on the end faces (vector).

In accordance with one embodiment of the connection arrangement, the clamping device engages around the first and/or second ceramic component and/or engages into the first and/or second ceramic component. In order that the clamping device can clamp the first ceramic component against the second ceramic component in a force-fit manner, it needs to exert a force on both ceramic components. In order to be able to exert a force on a ceramic component, the clamping device can engage into the ceramic component at a recess of the ceramic component. Alternatively, the clamping device can also engage around the ceramic component, for example at the position of a bulge of the ceramic component.

In accordance with a further embodiment of the connection arrangement, the clamping device has a limb and a clamp, wherein the limb is fastened to the clamp in a swivelable manner. The limb and the clamp can engage in recesses of the ceramic components. As a result of the limb being fastened to the clamp in a swivelable manner, it is possible to set the forces with which the limb and clamp press on the ceramic components.

In accordance with a further embodiment of the connection arrangement, a force exerted by the limb and a force exerted by the clamp each lie in a wall plane of the ceramic components. As a result, the exerted forces can be implemented perpendicular to the contact surfaces to be connected in a force-fit manner.

In accordance with a further embodiment of the connection arrangement, the first ceramic component includes a first recess and a first ceramic flange with a first side and a second side. Furthermore, the second ceramic component includes a second recess and a second ceramic flange with a first side and a second side. The first side of the first ceramic flange is pressed against the first side of the second ceramic flange by the clamping device in such a way that there is a force-fit connection between both ceramic flanges. The limb of the clamping device, in the first recess of the first ceramic component, exerts the force on the second side of the first ceramic flange and the clamp of the clamping device, in the second recess of the second ceramic component, exerts the force on the second side of the second ceramic flange.

In accordance with a further embodiment of the connection arrangement, the ceramic flanges have a T-shaped cross section with a foot and a web. Advantageously, the T-shaped cross section allows the implementation of an enlarged first side of a ceramic flange, i.e. an increased force-introduction surface.

In accordance with a further embodiment of the connection arrangement, the ceramic flanges have raised contact surfaces on the first sides thereof. Advantageously, the raised contact surfaces allow the actual contact area to be reduced.

In accordance with a further embodiment of the connection arrangement, the forces exerted by the limb and the clamp are respectively perpendicular to the first sides and/or the raised contact surfaces. Advantageously, the ceramic flanges can thereby be connected in a suitable force-fit manner.

In accordance with a further embodiment of the connection arrangement, the first side of the first ceramic flange is parallel to the first side of the second ceramic flange and/or the raised contact surface of the first ceramic flange is parallel to the raised contact surface of the second ceramic flange. As a result of the surfaces that are pressed on one another in a force-fit manner being parallel to one another, there can be a good realization of a force-fit connection.

In accordance with a further embodiment of the connection arrangement, a first compensation element is provided between the first ceramic flange of the first ceramic component and the limb of the clamping device for compensating tolerances between the first ceramic flange and the limb and/or a second compensation element is provided between the second ceramic flange of the second ceramic component and the clamp of the clamping device for compensating tolerances between the second ceramic flange and the clamp. The compensation element can ensure that a difference in the embodiment of the contact surface of the limb or the contact surface of the clamp and a second side of a ceramic flange is compensated for. Moreover, the compensation element can compensate an inclined position of the limb or the clamp in relation to the surfaces to be connected in a force-fit manner.

In accordance with a further embodiment of the connection arrangement, the limb has a recess corresponding to the first compensation element and/or the clamp has a recess corresponding to the second compensation element. Advantageously, this results in an ideal force transmission.

In accordance with a further embodiment of the connection arrangement, the first compensation element is attached to the second side of the first ceramic flange in the first recess of the first ceramic component and/or the second compensation element is attached to the second side of the second ceramic flange in the second recess of the second ceramic component. As a result, the respective compensation element is attached precisely to the position at which the limb and the clamp exert forces onto the ceramic components.

In accordance with a further embodiment of the connection arrangement, the first compensation element has a polished contact surface and/or the second side of the first ceramic flange has a polished contact surface and/or the second compensation element has a polished contact surface and/or the second side of the second ceramic flange has a polished contact surface. A compensation element can be applied well to a ceramic flange in the case of polished contact surfaces. Moreover, there cannot be local pressure points on the second side of the ceramic flange in the case of polished contact surfaces.

In accordance with a further embodiment of the connection arrangement, the first compensation element is adhesively bonded to the second side of the first ceramic flange and/or the second compensation element is adhesively bonded to the second side of the second ceramic flange. Alternatively, compensation elements can also be fastened to ceramic flanges in another way.

In accordance with a further embodiment of the connection arrangement, the first compensation element is embodied as a spherical cap and/or the second compensation element is embodied as a spherical cap. In the case of a corresponding shape of the contact surface of the limb or the contact surface of the clamp, the shape of the spherical cap renders it possible to be able to vary the inclination of the limb or the inclination of the clamp.

In accordance with a further embodiment of the connection arrangement, the clamping device has a shaft for fastening the limb to the clamp in a swivelable manner and a movement screw for setting the exerted force. Advantageously, the exerted force can be set as desired via the movement screw.

In accordance with a further embodiment of the connection arrangement, the clamp of the clamping device has elliptical curvature. As a result, the forces exerted by the limb and clamp are distributed in a suitable manner.

In accordance with a further embodiment of the connection arrangement, the ceramic components include silicon carbide (SiSiC). Advantageously, this material only exhibits little thermal expansion.

Furthermore, a sensor frame for a lithography apparatus having a connection arrangement as described above is proposed.

Furthermore, a lithography apparatus having a sensor frame as described above or having a connection arrangement as described above is proposed.

Furthermore, a method for a force-fit connection between ceramic components for a lithography apparatus, including the following steps, is proposed. In a first step a), a first ceramic component is positioned directly next to a second ceramic component. In a second step b), the first ceramic component is pressed onto the second ceramic component via a clamping device, wherein the first and second ceramic components are clamped against one another in a force-fit manner.

The embodiments and features described for the proposed device apply correspondingly to the proposed method.

Further possible implementations of the disclosure also include combinations of features or embodiments described above or below in relation to the exemplary embodiments, even if they have not been mentioned explicitly. Here, a person skilled in the art will also add individual aspects as improvements or additions to the respective basic form of the disclosure.

Further advantageous embodiments and aspects of the disclosure are the subject matter of the dependent claims and the exemplary embodiments of the disclosure described below.

BRIEF DESCRIPTION OF THE DRAWINGS

Furthermore, the disclosure is explained in more detail on the basis of preferred embodiments, with reference being made to the attached figures, in which.

DETAILED DESCRIPTION

If nothing else is specified, the same reference signs in the figures denote equivalent or functionally equivalent elements. Furthermore, it should be noted that the illustrations in the figures are not necessarily true to scale.

Figure 1:
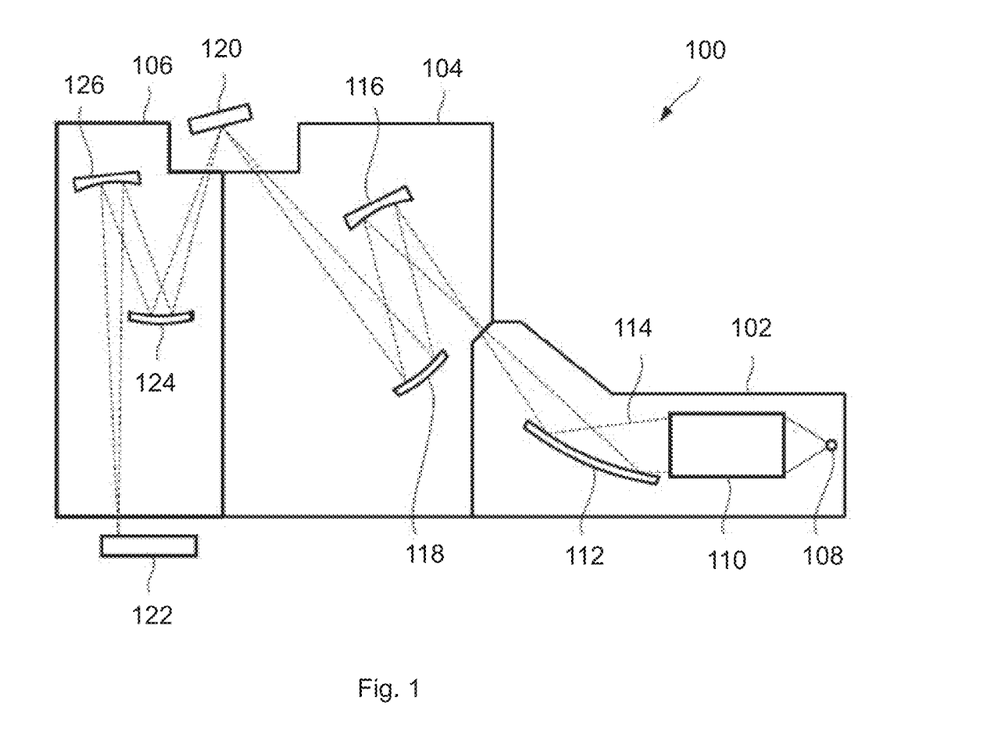
FIG. 1 shows a schematic view of an EUV lithography apparatus.

FIG. 1 shows a schematic view of an EUV lithography apparatus 100, which includes a beam forming system 102, an illumination system 104 and a projection system 106. The beam forming system 102, the illumination system 104 and the projection system 106 are respectively provided in a vacuum housing, which is evacuated via an evacuation device not depicted in any more detail. The vacuum housings are surrounded by a machine room not depicted in any more detail, in which the drive devices for mechanically displacing or setting the optical elements are provided. Furthermore, electrical controls or the like may also be provided in this machine room.

The beam forming system 102 has an EUV light source 108, a collimator 110 and a monochromator 112. By way of example, a plasma source or a synchrotron, which emits radiation in the EUV range (extreme ultraviolet range), that is to say e.g. in the wavelength range from 5 nm to 20 nm, may be provided as EUV light source 108. The radiation emerging from the EUV light source 108 is initially focused by the collimator 110, after which the desired operating wavelength is filtered out via the monochromator 112. Thus, the beam forming system 102 adapts the wavelength and the spatial distribution of the light emitted by the EUV light source 108. The EUV radiation 114 produced by the EUV light source 108 has relatively low transmissivity through air, which is why the beam guiding spaces in the beam forming system 102, in the illumination system 104 and in the projection system or projection lens 106 are evacuated.

In the depicted example, the illumination system 104 has a first mirror 116 and a second mirror 118. By way of example, these mirrors 116, 118 can be embodied as facet mirrors for forming a pupil and guide the EUV radiation 114 onto a photomask 120.

The photomask 120 is likewise embodied as a reflective optical element and can be arranged external to the systems 102, 104, 106. The photomask 120 has a structure which is imaged in a reduced manner on a wafer 122 or the like via the projection system 106. To this end, the projection system has e.g. a third mirror 124 and a fourth mirror 126 in the beam guiding space 106. It should be noted that the number of mirrors in the EUV lithography apparatus 100 is not restricted to the depicted number, and provision can also be made of more or fewer mirrors. Moreover, the mirrors are generally curved on the front side thereof for beam forming.

Figure 2A:
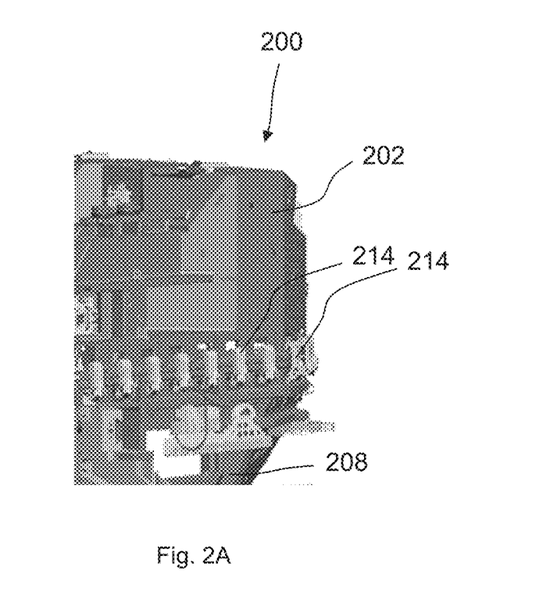
FIG. 2A shows a perspective view of part of a sensor frame of a projection system from FIG. 1.

The projection system 106 may include a sensor frame 200, shown in part in FIG. 2A, and a force frame not shown here. The force frame may carry various sub-components such as e.g. actuators and active mirrors. As a fixed reference, the sensor frame 200 can carry the sensors and the only passive mirror. Furthermore, the sensor frame 200 can be assembled around the completely assembled force frame.

One function of the sensor frame 200 lies in providing a highly rigid support structure as a global reference. Additionally, accessibility to the internal structure is to be ensured. The thermal deformation of the sensor frame 200 needs to be reduced to a minimum. In order to ensure this in the pm-range, use is preferably made of ceramic material.

In general, a sensor frame sometimes consists of five ceramic components, the so-called shells. Shown in FIG. 2A are a top shell 202 and a first central shell 208. By contrast, a bottom shell, a second central shell and a front shell of the sensor frame 200 are not shown in order to provide a better overview. The first central shell 208, the second central shell and the front shell form a central assembly.

As can be seen in FIG. 2A, the top shell 202 and the first central shell 208 are held together via clamping devices 214. Furthermore, e.g. the first central shell 208 and the bottom shell are held together via clamping devices 214 (not shown here).

The ceramic components 202, 208 are very stiff monolithic ceramic components. In particular, the ceramic components 202, 208 may contain silicon carbide (SiSiC).

Figure 2B:
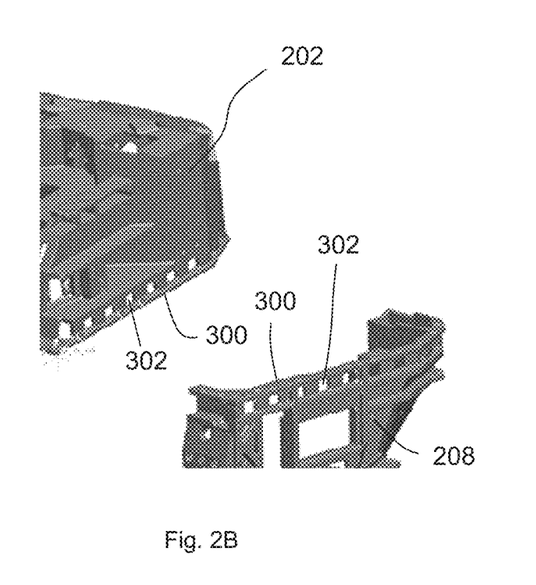
FIG. 2B shows a perspective view of individual components of the sensor frame.

The central assembly mentioned above is particularly relevant to the overall stiffness of the sensor frame 200. The first central shell 208 can be connected to the top shell 202 via ceramic flanges 300 shown in FIG. 2B. To be more precise, the ceramic flanges 300 of the ceramic components 202, 208 can be clamped against one another in a force-fit manner via the clamping devices 214. Here, the clamping devices 214 can engage in recesses 302 in the form of rectangular windows in the ceramic components 202, 208. FIG. 2B shows the ceramic components 202, 208 in an exploded view. It is possible to identify the ceramic flanges 300 and the recesses 302 in this illustration.

Figure 3:
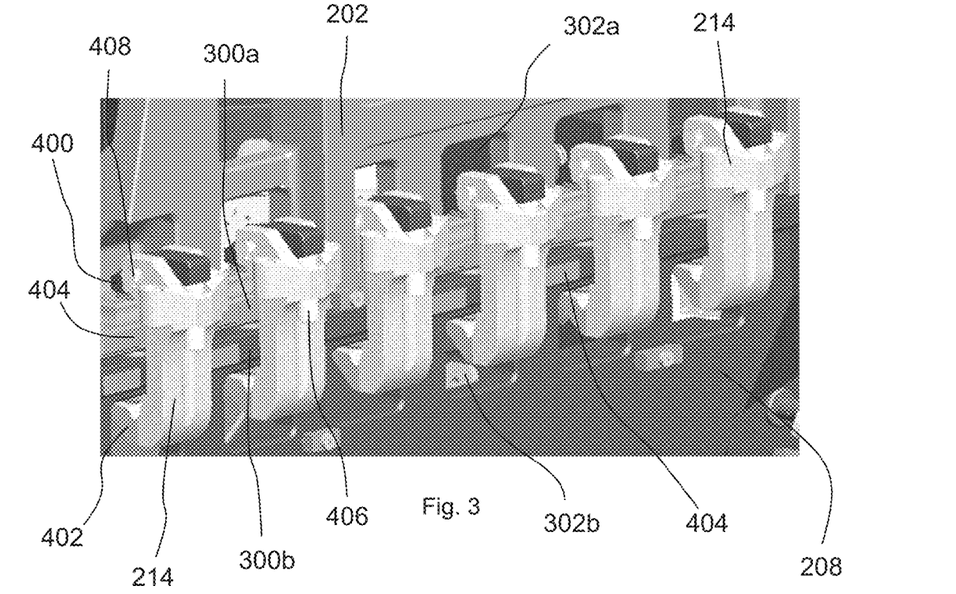
FIG. 3 shows a magnified view from FIG. 2A.

FIG. 3 shows a perspective view of two connected ceramic components 202, 208. What is shown here are clamping devices 214—six are shown here in an exemplary manner—which each engage into a first recess 302a of a ceramic component 202 and into a second recess 302b of a ceramic component 208. As an alternative to the recesses 302 shown in FIG. 3, the ceramic components 202, 208 can also have bulges, e.g. corresponding protruding edges. The clamping devices 214 would then engage around the bulges or edges.

Any number of clamping devices 214 can be used for the force-fit connection of the first and second ceramic flange 300a, 300b.

Figure 4:
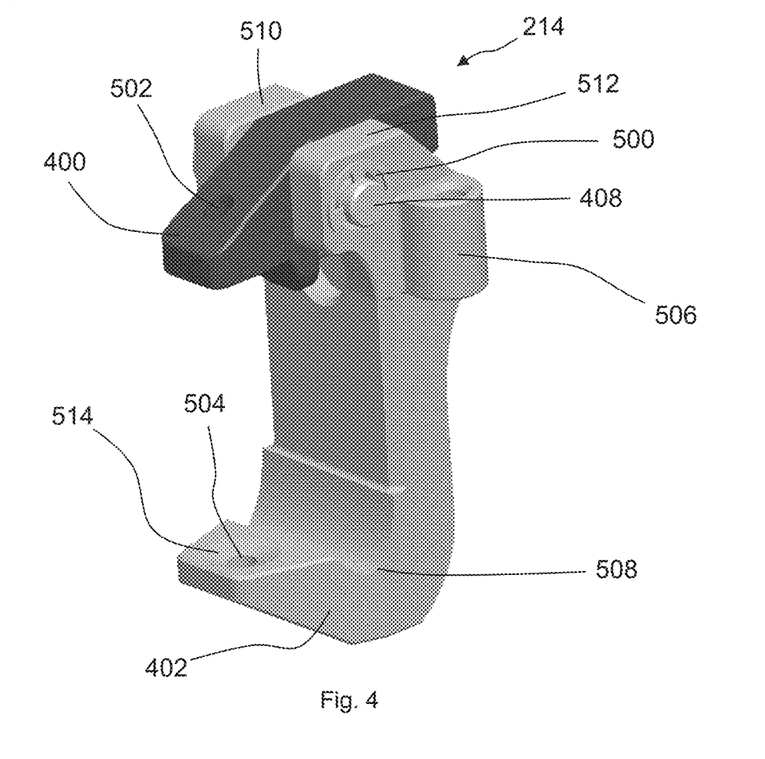
FIG. 4 shows a perspective view of a clamping device.

As can be seen in FIG. 4, the clamping devices 214 each have a limb 400 and a clamp 402. In the clamping device 214, the limb 400 is fastened to the clamp 402 in a swivelable manner. The respective limb 400 can be fastened in a rotatable manner on the clamp via a shaft 408. The ceramic components 202, 208 can be measured and aligned in relation to one another via polished position markings 404, to be precise in such a way as they are to be connected to one another in a force-fit manner. The clamping devices 214 each engage around a first ceramic flange 300a of a first ceramic component 202 and a second ceramic flange 300b of a second ceramic component 208. The limb 400 can be swiveled about the shaft 408 via a movement screw 406 of the clamping device 214. Using this, pressure is exerted on the first ceramic flange 300a and the second ceramic flange 300b.

It is possible, particularly in the clamping device 214 depicted in FIG. 4, for the limb 400 to be mounted between ends 510, 512, which are branched in the manner of a fork, of the clamp 402. The axle or shaft 408 extends through the first branched end 510 of the clamp 402, the limb 400 and the second branched end 512 of the clamp 402 in such a way that the limb 400 can rotate about the shaft 408. The securing ring 500, which is provided both on the first and on the second branched end 510, 512, prevents the shaft 408 from falling out of the clamp.

The limb 400 can include steel and, in particular, chromium nickel steel. The clamp 402 may likewise include steel. An assembly device for assembling the clamping device 214 may be fastened to the element 506 with a threaded bore. The clamp 402 has the shape of a hook. A curvature 508 at the end thereof facing away from the limb 400 may have an elliptical form. The elliptical curvature 508 of the clamp 402 ensures an ideal distribution of the forces, which are exerted by limb 400 and clamp 402, and prevents an unwanted spreading of the clamp 402 when the movement screw 406 is tightened.

The clamping device 214 is provided for use in a vacuum. A ventilation hole 504 of the clamp 402 ensures that no enclosed bubble of air may form between a contact surface 514 of the clamp 402 and the ceramic flange 300. A ventilation hole 502 is provided analogously for the limb 400.

Figure 5:
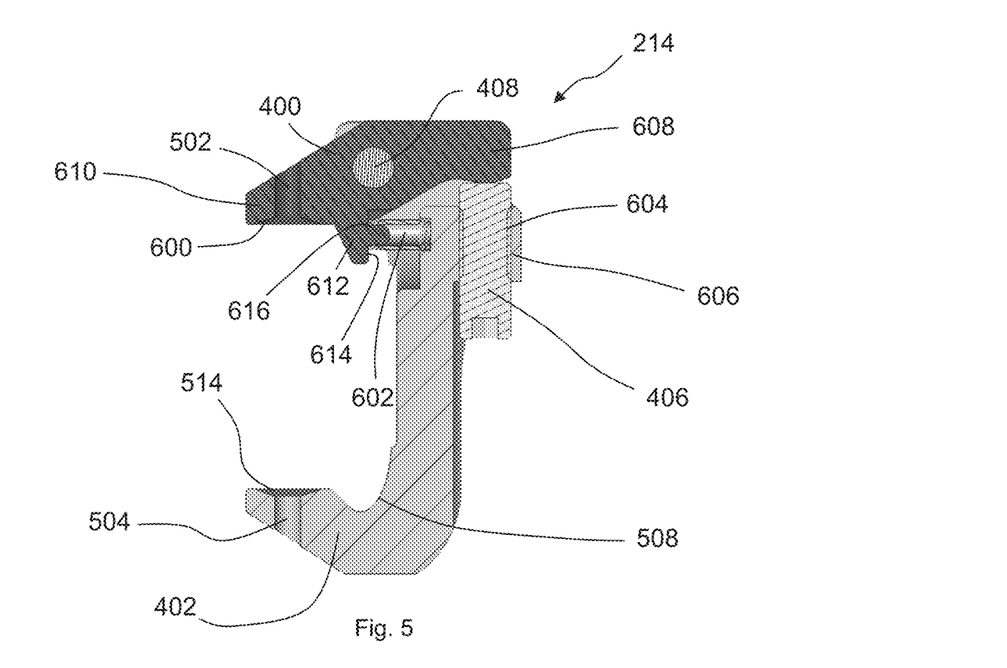
FIG. 5 shows a section through the clamping device from FIG. 4.

FIG. 5 shows a sectional view of the clamping device 214 shown in FIG. 4. Using the movement screw 406, it is possible to set the force with which the limb 400 and clamp 402 press on the ceramic flanges 300. The movement screw 406 has a thread 604. The clamp 402 of the clamping device 214 has a corresponding counter thread 606. By rotation, the movement screw 406 can screw upward with the thread 604 thereof in the counter thread 606 of the clamp 402 such that a rear end 608 of the limb 400 is pressed upward. Due to the mount of the limb 400 in a manner swivelable about the shaft 408, this brings about a lowering of a front end 610 of the limb 400. A contact surface 600 of the limb 400 and the contact surface 514 of the clamp 402 can then press on two ceramic flanges which are situated between limb 400 and clamp 402. The contact surface 600 of the limb 400 and the contact surface 514 of the clamp 402 can have a cone-shaped embodiment.

The limb 400 can have a projection 612. On this projection there is a surface 614, from which a pin 616 protrudes. The pin 616 presses together a return spring 602 when the movement screw 406 moves upward. An advantage of this is that the limb 400 returns to the initial position thereof by the restoration force of the return spring 602 when the movement screw 406 is rotated backward.

Figure 6:
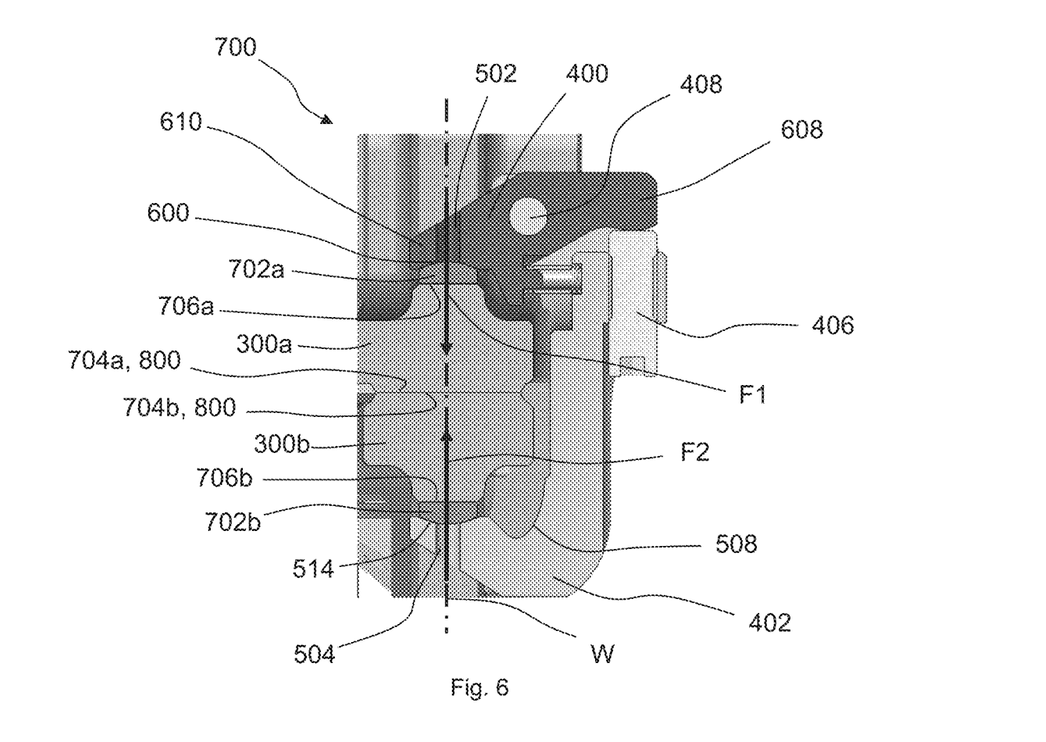
FIG. 6 shows a section through a connection arrangement from FIG. 3.

FIG. 6 shows a connection arrangement 700 for a force-fit connection between ceramic components 202, 208. What can be seen is the clamping device 214 already shown in FIGS. 4 and 5. The clamping device 214 clamps two ceramic flanges 300 against one another in a force-fit manner. To this end, the front end 610 of the limb 400 presses against the first ceramic flange 300a and the clamp 402 presses against the second ceramic flange 300b. By way of example, the shown ceramic flanges 300 have a T-shaped cross section.

As shown in FIG. 6, compensation elements 702 can be used between the limb 400 or the clamp 402 and the respective ceramic flange 300. What can be seen is that the front end 610 of the limb 400 exerts a force F1 on the first compensation element 702a by way of the contact surface 600. The first compensation element 702a is in turn pressed on an outer side 706a of the first ceramic flange 300a. The clamp 402 exerts a second force F2 on the second compensation element 702b by way of the contact surface 514 thereof. The second compensation element 702b is in turn pressed on an outer side 706b of the second ceramic flange 300b. Therefore, an inner side 704a of the first ceramic flange 300a is also pressed directly, i.e. ceramic against ceramic without further components being disposed therebetween, on an inner side 704b of the second ceramic flange. Then, there is a force-fit connection as a result of frictional engagement between the first ceramic flange 300a and the second ceramic flange 300b in a plane of the surfaces 704a, 704b. There is a force-fit by way of the clamping device 214 in a direction perpendicular to the aforementioned plane, i.e. in the direction in which the forces F1, F2 act.

The force F1 exerted by the limb 400 and the force F2 exerted by the clamp 402 extend along a wall plane W in opposite directions. An advantage of this is that the forces introduced and emerging by way of the corresponding walls of the ceramic components 202, 208 can be well absorbed therein and, in particular, do not, or hardly, subject these to bending loads.

The first compensation element 702a ensures tolerance compensation between the first ceramic flange 300a and the limb 400. The second compensation element 702b ensures tolerance compensation between the second ceramic flange 300b and the clamp 402. The compensation elements 702 may include steel.

Furthermore, the compensation element 702 can be used to compensate an inclined position of the limb 400 or of the clamp 402 in relation to the surfaces 704a, 704b to be connected with force fit. Here, the limb 400 or the clamp 402 preferably has a recess corresponding to the corresponding compensation element 702a, 702b, which have the contact surfaces 514, 600. Furthermore, the respective compensation element 702a, 702b can be embodied as a spherical cap.

In order that the compensation element 702a, 702b cannot, as far as possible, produce pressure and tension peaks in the ceramic flange 300, a polished contact surface of the compensation element 702a, 702b and a polished contact surface at the sides 706a, 706b of the ceramic flanges 300 is advantageous.

The compensation elements 702a, 702b can be adhesively bonded onto the sides 706a, 706b of the ceramic flanges 300, in particular via a multicomponent adhesive. However, the compensation elements 702a, 702b can also be fastened in a different manner.

Figure 7:
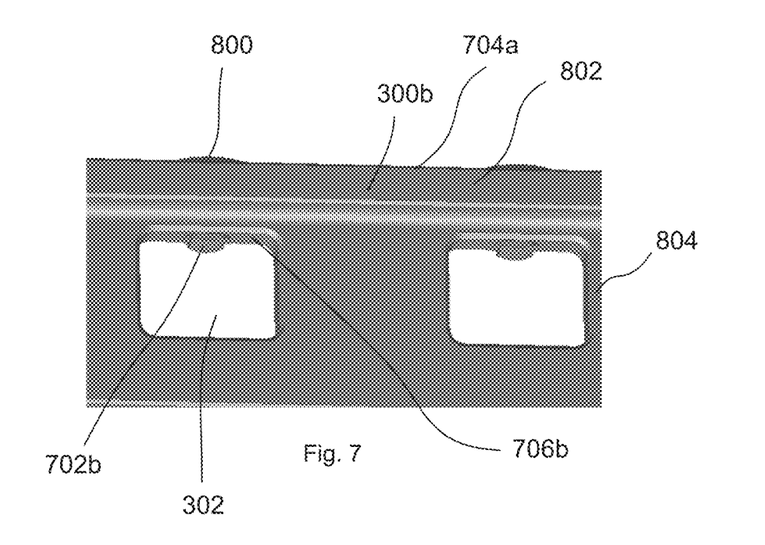
FIG. 7 shows a perspective view of a ceramic flange.
Figure 8:
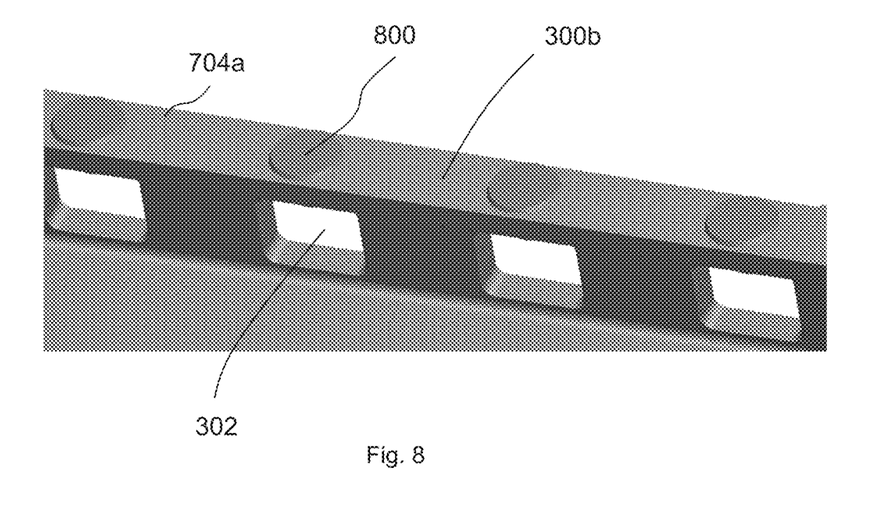
FIG. 8 shows a further perspective view of the ceramic flange from FIG. 7.

FIG. 7 shows a perspective view, from obliquely below, of a ceramic component 202, 208 including the ceramic flange 300b from FIG. 6, while FIG. 8 shows the view from obliquely above. The shown ceramic flange 300b has a T-shape and includes a web 804 and a foot 802. Furthermore, on the inner side 704 thereof, the ceramic flange 300b has polished, raised contact surfaces 800. In the recesses 302, the compensation elements 702b are attached to the outer side of the ceramic flange 300. In this case, the direct contact between the ceramic components 202, 208 only emerges by way of the contact surfaces 800, as is also elucidated in FIG. 6.

By using the T-shaped ceramic flanges 300, it is possible to implement a large force-introduction surface. At the same time, the whole connection surface of the ceramic flanges 300 can be reduced by using the raised contact surfaces 800.

Although the present disclosure was described on the basis of exemplary embodiments, it is in no way restricted thereto; rather, it is modifiable in a variety of ways.

Alternatively, the limb 400 of the clamping device 214 may have a ball-and-socket joint. In this case, the first compensation element 702a is connected to the ball-and-socket joint.

The clamp 402 of the clamping device 214 can likewise have a ball-and-socket joint, which may be connected to the second compensation element 702b.

In an alternative embodiment, the limb 400 may be spread. Therefore, a spread lever arm emerges.

In a further alternative embodiment, the clamping device 214 may include a screw clamp.

In a further alternative embodiment, the clamping device 214 may have resilient elements for compensating a possible thermal resilience of the ceramic components 202, 208.

The lithography apparatus 100 need not be an EUV lithography apparatus; rather, it is also possible to use light with different wavelengths (e.g. 193 nm via ArF excimer lasers). Furthermore, it is also possible for lenses to be used in place of the aforementioned mirrors, particularly in the aforementioned projection system 106.

In principle, any components, in particular any shells, may be connected to one another via the clamping devices 214.

LIST OF REFERENCE SIGNS

100 EUV lithography apparatus
102 Beam forming system
104 Illumination system
106 Projection system
108 EUV light source
110 Collimator
112 Monochromator
114 EUV radiation
116 First mirror
118 Second mirror
120 Photomask
122 Wafer
124 Third mirror
126 Fourth mirror
200 Sensor frame
202 Top shell
208 First central shell
214 Clamping device
300 Ceramic flange
300a First ceramic flange
300b Second ceramic flange
302 Recess
302a First recess
302b Second recess
400 Limb
402 Clamp
404 Position marking
406 Movement screw
408 Shaft
500 Securing ring
502 Ventilation hole of the limb
504 Ventilation hole of the clamp
506 Element with a threaded bore
508 Curvature
510 First branched end of the clamp
512 Second branched end of the clamp
514 Contact surface of the clamp
600 Contact surface of the limb
602 Return spring
604 Thread of the screw
606 Thread of the clamping device
608 Rear end of the limb
610 Front end of the limb
612 Projection at the limb
614 Surface at the projection of the limb
616 Pin at the surface of the projection
700 Connection arrangement
702 Compensation element
702a First compensation element
702b Second compensation element
704 First side of a ceramic flange
704a First side of the first ceramic flange
704b First side of the second ceramic flange
706 Second side of a ceramic flange
706a Second side of the first ceramic flange
706b Second side of the second ceramic flange
800 Raised contact surface of the ceramic flange
802 Foot
804 Web
F1 Force exerted by the limb
F2 Force exerted by the clamp
W Wall plane

What is claimed is:

1. An apparatus, comprising:
   an arrangement, a first ceramic component;
   a second ceramic component; and
   a clamping device that directly clamps the first and the second ceramic components against each other in a force-fit manner,
   wherein the clamping device comprises a limb and a clamp, and the limb is fastened to the clamp in a swivelable manner, and
   wherein the apparatus is a lithography apparatus.

2. The apparatus of claim 1, wherein at least one of the following holds:
   the clamping device engages around at least one component selected from the group consisting of the first ceramic component and the second ceramic component;
   the clamping device engages into at least one component selected from the group consisting of the first ceramic component and the second ceramic component.

3. The apparatus of claim 1, wherein the clamping device comprises:
   a shaft configured to fasten the limb to the clamp in a swivelable manner; and
   a movement screw configured to set forces exerted by the clamping device on the first and second ceramic components.

4. The arrangement apparatus of claim 1, wherein the clamp has an elliptical curvature.

5. The apparatus of claim 1, wherein the arrangement is configured so that a force exerted by the limb and a force exerted by the clamp each lie in a wall plane of the first and second ceramic components.

6. The apparatus of claim 5, wherein:
   the first ceramic component comprises a first recess and a first ceramic flange with first and second sides;
   the second ceramic component comprises a second recess and a second ceramic flange with first and second sides;
   the clamping device presses the first side of the first ceramic flange against the first side of the second ceramic flange to provide a force fit between the first and second ceramic flanges;
   in the first recess the limb exerts a force on the second side of the first ceramic flange; and
   in the second recess, the clamp exerts a force on the second side of the second ceramic flange.

7. The apparatus of claim 6, wherein each of the first and second ceramic flanges has a T-shaped cross section with a foot and a web.

8. The arrangement of claim 6, wherein each of the first and second ceramic flanges has raised contact surfaces on its first side.

9. The apparatus of claim 8, wherein at least one of the following holds:
   the forces exerted by the limb and the clamp are respectively perpendicular to the first sides; and the forces exerted by the limb and the clamp are respectively perpendicular the raised contact surfaces.

10. The apparatus of claim 8, wherein at least one of the following holds:
the first side of the first ceramic flange is parallel to the first side of the second ceramic flange; and
the raised contact surface of the first ceramic flange is parallel to the raised contact surface of the second ceramic flange.

11. The apparatus of claim 6, further comprising at least one of the following:
a first compensation element between the first ceramic flange and the limb of the clamping device to compensate tolerances between the first ceramic flange and the limb; and
a second compensation element between the second ceramic flange and the clamp of the clamping device to compensate tolerances between the second ceramic flange and the clamp.

12. The apparatus of claim 11, wherein at least one of the following holds:
the limb has a recess corresponding to the first compensation element; and
the clamp has a recess corresponding to the second compensation element.

13. The apparatus of claim 11, wherein at least one of the following holds:
the first compensation element is connected to the second side of the first ceramic flange in the first recess; and
the second compensation element is connected to the second side of the second ceramic flange in the second recess.

14. The apparatus of claim 11, wherein at least one of the following holds:
the first compensation element has a polished contact surface;
the second side of the first ceramic flange has a polished contact surface;
the second compensation element has a polished contact surface; and
the second side of the second ceramic flange has a polished contact surface.

15. The apparatus of claim 11, wherein at least one of the following holds:
the first compensation element is adhesively bonded to the second side of the first ceramic flange; and
the second compensation element is adhesively bonded to the second side of the second ceramic flange.

16. The apparatus of claim 11, wherein at least one of the following holds:
the first compensation element is a spherical cap; and
the second compensation element is a spherical cap.

17. The apparatus of claim 1, wherein the first and second ceramic components comprise silicon carbide.

18. A sensor frame, comprising:
an arrangement, comprising:
a first ceramic component;
a second ceramic component; and
a clamping device that directly clamps the first and the second ceramic components against each other in a force-fit manner,
wherein the clamping device comprises a limb and a clamp, and the limb is fastened to the clamp in a swivelable manner, and
wherein the sensor frame is configured for use in a lithography apparatus.

19. The sensor frame of claim 18, wherein at least one of the following holds:
the clamping device engages around at least one component selected from the group consisting of the first ceramic component and the second ceramic component;
the clamping device engages into at least one component selected from the group consisting of the first ceramic component and the second ceramic component.

20. A method, comprising:
a) positioning a first ceramic component directly next to a second ceramic component;
b) using a clamping device, the clamping device comprising a limb and a clamp and the limb being fastened to the clamp in a swivelable manner, to press the first ceramic component against the second ceramic component to clamp the first and second ceramic components against each other in a force-fit manner to provide an arrangement; and
disposing the arrangement in a lithography apparatus.

* * * * *

UNITED STATES PATENT AND TRADEMARK OFFICE
CERTIFICATE OF CORRECTION

PATENT NO. : 10,571,813 B2
APPLICATION NO. : 15/455524
DATED : February 25, 2020
INVENTOR(S) : Karsten Siegmanski et al.

Page 1 of 1

It is certified that error appears in the above-identified patent and that said Letters Patent is hereby corrected as shown below:

In the Drawings

Sheet 5 of 5 (Fig. 7), Line 1 (approx.), delete "704a" and insert -- 704b --;

Sheet 5 of 5 (Fig. 8), Line 1 (approx.), delete "704a" and insert -- 704b --;

In the Claims

Column 10, Line 39, Claim 4, after "The" delete "arrangement";

Column 10, Line 61, Claim 8, delete "arrangement" and insert -- apparatus --;

Column 11, Line 2, Claim 9, after "perpendicular" insert -- to --.

Signed and Sealed this
Nineteenth Day of May, 2020

Andrei Iancu
*Director of the United States Patent and Trademark Office*